(12) United States Patent
Sano

(10) Patent No.: US 12,289,842 B2
(45) Date of Patent: Apr. 29, 2025

(54) METHOD OF MANUFACTURING FLEXIBLE SUBSTRATE

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 99 days.

(21) Appl. No.: 18/302,840

(22) Filed: Apr. 19, 2023

(65) Prior Publication Data

US 2023/0345644 A1  Oct. 26, 2023

(30) Foreign Application Priority Data

Apr. 22, 2022 (JP) ................. 2022-070752

(51) Int. Cl.
| | |
|---|---|
| B29C 65/00 | (2006.01) |
| H05K 1/02 | (2006.01) |
| H05K 3/28 | (2006.01) |
| H05K 3/46 | (2006.01) |
| B29C 65/02 | (2006.01) |
| B29C 65/48 | (2006.01) |
| B29C 65/50 | (2006.01) |
| B29C 65/52 | (2006.01) |

(Continued)

(52) U.S. Cl.
CPC ............ *H05K 3/4682* (2013.01); *H05K 1/028* (2013.01); *H05K 3/28* (2013.01); *B29C 65/02* (2013.01); *B29C 65/4815* (2013.01); *B29C 65/50* (2013.01); *B29C 65/524* (2013.01); *B29C 65/7419* (2013.01); *B29C 65/745* (2013.01); *B29C 65/7891* (2013.01); *B29C 65/7894* (2013.01); *B29C 66/02241* (2013.01); *B29C 66/0242* (2013.01); *B29C 66/431* (2013.01); *B29C 66/4332* (2013.01); *H05K 3/0017* (2013.01)

(58) Field of Classification Search
CPC ....... B29C 65/48; B29C 65/76; B32B 43/006; Y10T 156/1158; Y10T 156/1917
See application file for complete search history.

(56) References Cited

U.S. PATENT DOCUMENTS

| | | | |
|---|---|---|---|
| 2006/0091394 A1* | 5/2006 | Honda .............. | H01L 29/78678 257/E21.414 |
| 2007/0197049 A1* | 8/2007 | Tanaka ................. | B23K 26/067 438/795 |

(Continued)

FOREIGN PATENT DOCUMENTS

JP  2017-113088 A  6/2017

*Primary Examiner* — Philip C Tucker
*Assistant Examiner* — Nickolas R Harm
(74) *Attorney, Agent, or Firm* — Michael Best & Friedrich LLP

(57) ABSTRACT

According to one embodiment, a method of manufacturing a flexible substrate, includes forming a release layer on a glass substrate, forming an insulating base, forming a plurality of insulating layers, wiring lines and electrical elements, asking the release layer, the insulating base and the plurality of insulating layers from above to the glass substrate via a mask, forming an upper resin layer, removing the glass substrate and the release layer by peeling off an interface between the release layer and the insulating base and forming a lower resin layer so as to be in contact with a lower surface of the insulating base and a lower surface of the upper resin layer.

8 Claims, 18 Drawing Sheets

(51) Int. Cl.
　　　*B29C 65/74*　　　(2006.01)
　　　*B29C 65/78*　　　(2006.01)
　　　*H05K 3/00*　　　(2006.01)

(56) References Cited

U.S. PATENT DOCUMENTS

| | | | |
|---|---|---|---|
| 2010/0276691 A1* | 11/2010 | Ichiryu | H01L 27/1218 |
| | | | 257/E21.414 |
| 2010/0301338 A1* | 12/2010 | Abe | H01L 27/1218 |
| | | | 257/E21.09 |
| 2011/0143501 A1* | 6/2011 | Oda | C08L 63/00 |
| | | | 257/E21.502 |
| 2015/0282294 A1 | 10/2015 | Wakuda et al. | |
| 2015/0282296 A1 | 10/2015 | Ogura et al. | |
| 2016/0028034 A1* | 1/2016 | Yasumoto | H10K 71/80 |
| | | | 438/22 |
| 2017/0003813 A1* | 1/2017 | Kurasawa | G06F 3/044 |
| 2017/0054029 A1* | 2/2017 | Koezuka | H01L 21/02557 |
| 2017/0181276 A1 | 6/2017 | Sawada et al. | |
| 2021/0295007 A1* | 9/2021 | Yoo | G06F 1/1684 |

\* cited by examiner

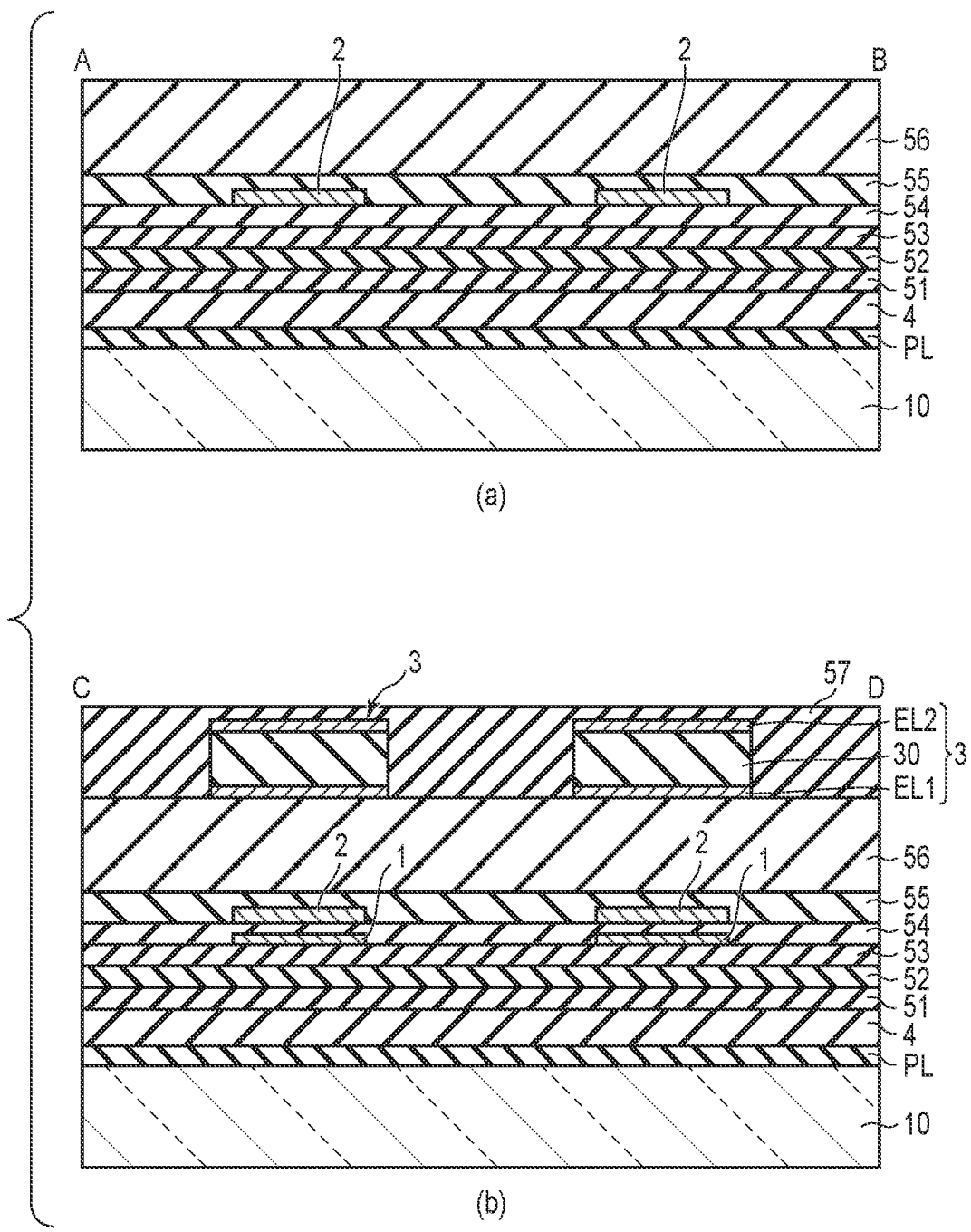
F I G. 6

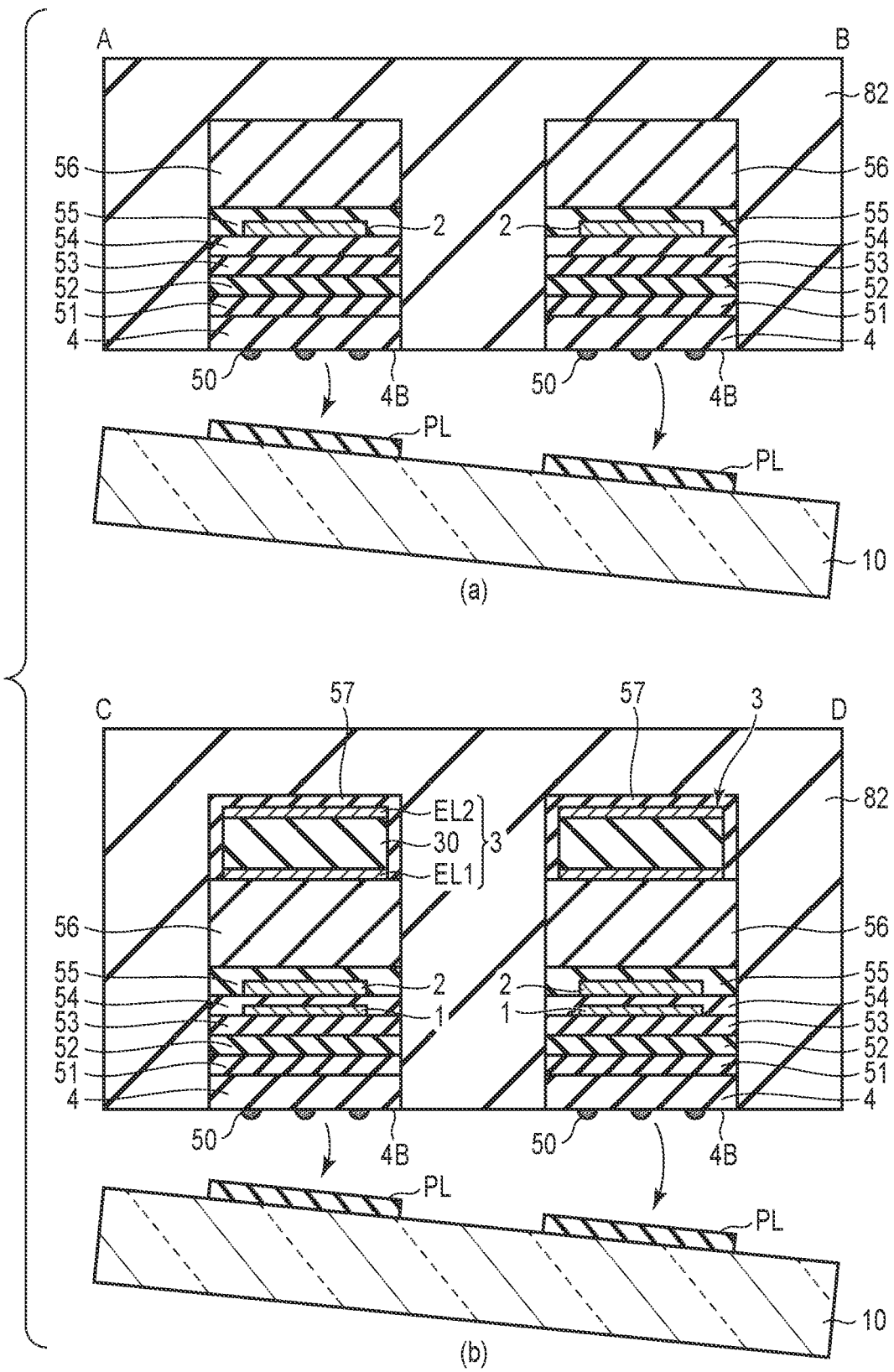
F I G. 9

METHOD OF MANUFACTURING FLEXIBLE
SUBSTRATE

CROSS-REFERENCE TO RELATED
APPLICATIONS

This application is based upon and claims the benefit of priority from Japanese Patent Application No. 2022-070752, filed Apr. 22, 2022, the entire contents of which are incorporated herein by reference.

FIELD

Embodiments described herein relate generally to a method of manufacturing a flexible substrate.

BACKGROUND

In recent years, the use of flexible substrates with flexibility and elasticity has been studied in various fields. For example, such use can be considered that a flexible substrate with electrical elements arrayed in a matrix shape is attached to a curved surface such as of the housing of an electronic device, human body or the like. As electrical elements, various sensors such as touch sensors and temperature sensors, display elements and the like can be applied.

In flexible substrates, it is necessary to take measures to prevent the wiring from being damaged by stress caused by bending or stretching. As such measures, for example, it has been proposed to provide honeycomb-shaped openings in the base that supports the wiring or to shape the wiring into a meandering manner (meander shape).

BRIEF DESCRIPTION OF THE DRAWINGS

FIG. 6 is a diagram showing the third processing step of the method of manufacturing the flexible substrate according to the first embodiment.
FIG. 9 is a diagram showing the sixth processing step of the method of manufacturing the flexible substrate according to the first embodiment.

DETAILED DESCRIPTION

Figure 1:
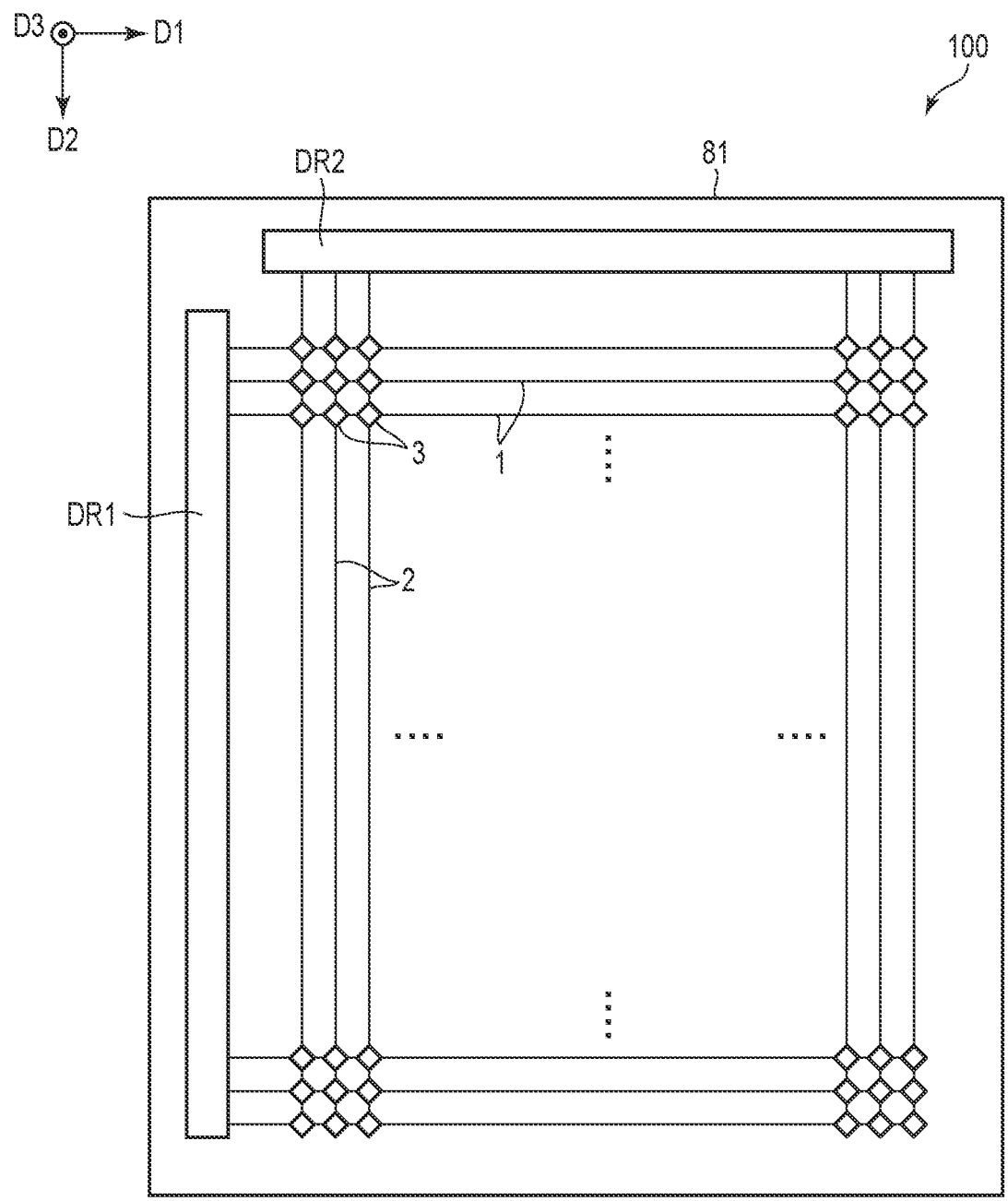
FIG. 1 is a plan view schematically showing a flexible substrate according to an embodiment.

In general, according to one embodiment, there is provided a method of manufacturing a flexible substrate, comprises forming a release layer on a glass substrate, forming an insulating base on the release layer, forming a plurality of insulating layers, wiring lines and electrical elements on the insulating base, asking the release layer, the insulating base and the plurality of insulating layers from above to the glass substrate via a mask, forming an upper resin layer which covers the release layer, the insulating base, and the plurality of insulating layers, removing the glass substrate and the release layer by peeling off at an interface between the release layer and the insulating base and forming a lower resin layer so as to be in contact with a lower surface of the insulating base and a lower surface of the upper resin layer.

According to another embodiment, there is provided a method of manufacturing a flexible substrate, comprises forming a release layer on a glass substrate, forming a barrier layer on the release layer, patterning the barrier layer, forming an insulating base on the barrier layer and the release layer, forming a plurality of insulating layers, wiring lines and electrical elements on the insulating base, attaching a temporary film above the electrical elements, removing the glass substrate and the release layer by peeling off at an interface between the release layer and the barrier layer, etching the insulating base and the plurality of insulating layers from below to the temporary film by laser irradiation using the barrier layer as a mask, forming a lower resin layer which covers the barrier layer, the insulating base and the plurality of insulating layers from below, removing the temporary film and forming an upper resin layer so as to be in contact with an upper surface of the lower resin layer.

According to still another embodiment, a flexible substrate includes a lower resin layer, an insulating base located on the lower resin layer and including a plurality of first strip portions extending along a first direction and aligned along a second direction intersecting the first direction, a plurality of second strip portions extending along the second direction and aligned along the first direction, and a plurality of island-shaped portions located at respective intersections of the first strip portions and the second strip portions, an insulating base located on the lower resin layer, a plurality of electrical elements overlapping the island-shaped portions, respectively and an upper resin layer which covers the insulating base and the electrical elements, and the upper resin layer is in contact with a side surface of the insulating base and a release layer residue is attached to a lower surface of the insulating base.

According to still another embodiment, a flexible substrate includes an insulating base including a plurality of first strip portions extending along a first direction and aligned along a second direction intersecting the first direction, a plurality of second strip portions extending along the second direction and aligned along the first direction, and a plurality of island-shaped portions located at respective intersections of the first strip portions and the second strip portions, a plurality of electrical elements overlapping the island-shaped portions, respectively, a barrier layer overlaid under the insulating base, a lower resin layer which covers the barrier layer, the insulating base, and the electrical elements from below, and an upper resin layer in contact with an upper surface of the lower resin layer, and the lower resin layer is in contact with a side surface of the insulating base and a release layer residue is attached to the lower surface of the barrier layer.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and an overlapping detailed description thereof is omitted unless otherwise necessary.

FIG. 1 is a plan view schematically showing a flexible substrate 100 according to the embodiment.

In this embodiment, a first direction D1, a second direction D2 and a third direction D3 are defined as shown in the figure. The first direction D1 and the second direction D2 are parallel to a main surface of the flexible substrate 10 and intersect each other. The third direction D3 is perpendicular to the first direction D1 and the second direction D2, and equivalent to the thickness direction of the flexible substrate 100. The first direction D1 and the second direction D2 intersect normal to each other in this embodiment, but they may intersect at an angle other than normal. In this specification, the direction toward the tip of the arrow indicating the third direction D3 is referred to as "upwards" and the direction from the tip of the arrow to the opposite direction is referred to as "downward". Further, it is assumed that there is an observation position for observing the flexible substrate 100 on the tip side of the arrow indicating the third direction D3, and viewing from this observation position toward a D1-D2 plane defined by the first direction D1 and the second direction D2 is called a plan view.

As shown in FIG. 1, the flexible substrate 100 includes a plurality of scanning lines 1, a plurality of signal lines 2, a plurality of electrical elements 3, a lower resin layer 81, a scanning line driver DR1 and a signal line driver DR2. The scanning lines 1, the signal lines 2, the electrical elements 3, the scanning line driver DR1 and the signal line driver DR2 are located on the lower resin layer 81.

The scanning lines 1 each extend along the first direction D1 and aligned along the second direction D2. The scanning lines 1 are each connected to the scanning line driver DR1. The signal lines 2 each extend along the second direction D2 and aligned along the first direction D1. The signal lines 2 are each connected to the signal line driver DR2. The electrical elements 3 are each located at an intersection between each scanning line 1 and each respective signal line 2 and are electrically connected to the scanning lines 1 and the signal lines 2, respectively.

To the electrical elements 3, scanning signals are supplied via the scanning lines 1, respectively. For example, if the electrical elements 3 are of a type such as sensors which output a signal, the output signal from each electrical element 3 is supplied to the respective signal line 2. Note that the scanning lines 1 and the signal lines 2 are examples of the wiring lines provided in the flexible substrate 100. In addition to the scanning lines 1 and signal lines 2, the flexible substrate 100 include other types of wiring lines, such as power lines that supply power to the electrical elements 3.

The scanning line driver DR1 functions as a supply source that supplies scanning signals to each of the scanning lines 1. Meanwhile, the signal line driver DR2 functions as a supply source that supplies drive signals to each of the signal lines 2, or as a signal processor that processes the output signals output to each of the signal lines 2.

Figure 2:
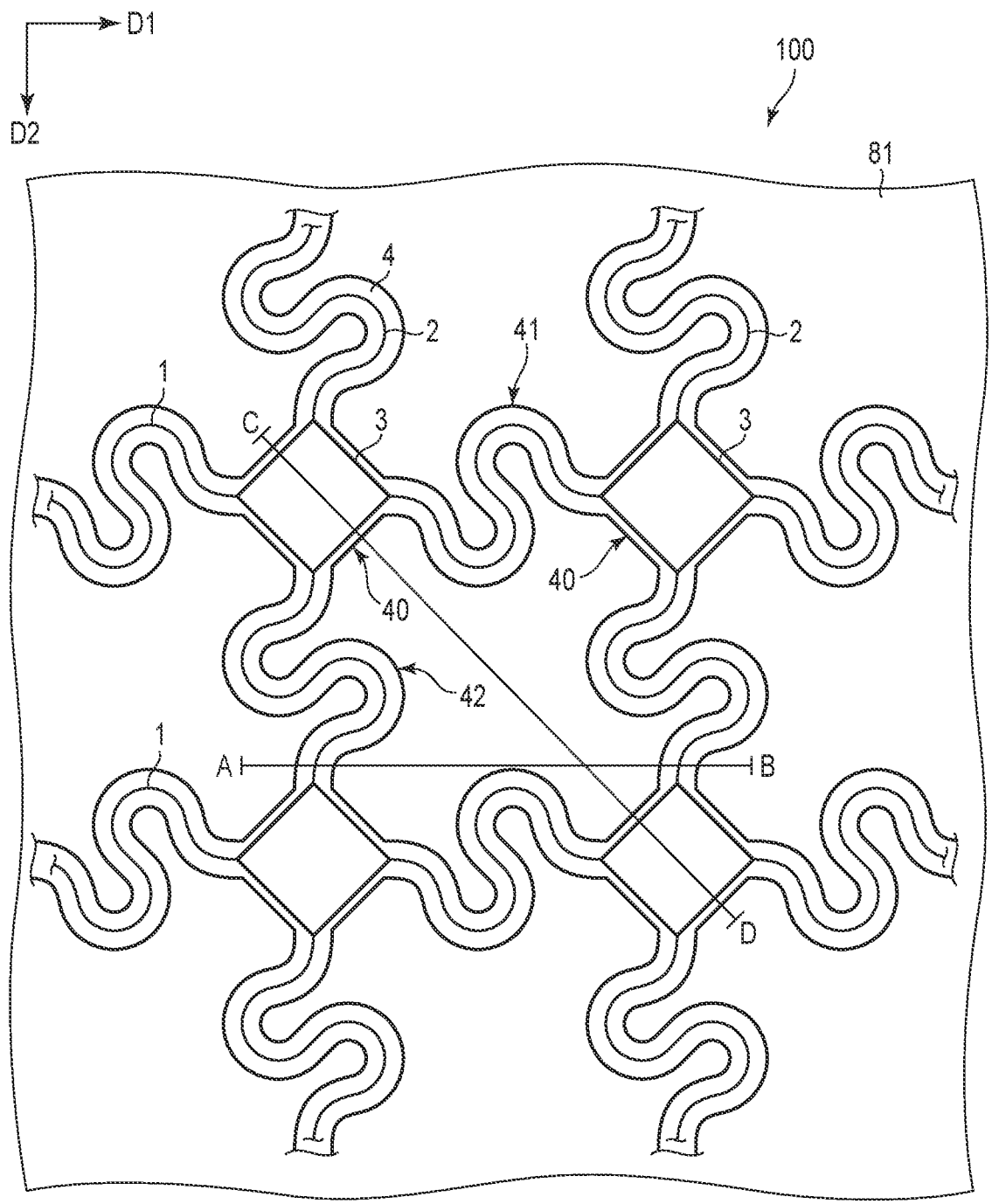
FIG. 2 is a partially enlarged plan view of the flexible substrate shown in FIG. 1.

FIG. 2 is a partially enlarged plan view of the flexible substrate 100 shown in FIG. 1.

As shown in FIG. 2, the flexible substrate 100 comprises, in addition to the above, an insulating base 4 that supports the scanning lines 1 and the signal lines 2. The insulating base 4 has elasticity and flexibility. The insulating base 4 is formed using polyimide, for example, but the material is not limited to that of this example.

The insulating base 4 includes a plurality of island-shaped portions 40, a plurality of first strip portions 41 and a plurality of second strip portions 42 which are integrated respectively with the island-shaped portions 40. The insulating base 4 is formed into a net-like shape. The plurality of island-shaped portions 40 are arranged to be spaced apart from each other in a matrix along the first direction D1 and the second direction D2. The island-shaped portions 40 are located at the respective intersections of the first strip portions 41 and the second strip portions 42. Each of the island-shaped portions 40 is formed into a quadrangular shape, for example, in plan view. The island-shaped portions 40 may be formed in other polygonal shapes or in circular or elliptical shapes. The electrical elements 3 respectively overlap the island-shaped portions 40.

The first strip portions 41 each extend generally along the first direction D1 and are aligned along the second direction D2. The first strip portions 41 connect a plurality of island-shaped portions 40 aligned in the first direction D1. The second strip portions 42 each extend generally along the second direction D2 and are aligned along the first direction D1. The second strip portions 42 connect a plurality of island-shaped portions 40 aligned along the second direction D2. The first strip portions 41 and the second strip portions 42 are each formed to be wavy in plan view. In other words, the first strip portions 41 and the second strip portions 42 are formed in a meander shape in plan view. The first strip portions 41 and the second strip portions 42 includes a plurality of tops 43 in plan view, respectively. The tops 43 correspond to peaks or troughs of the waveform.

The scanning lines 1 each extend while overlapping the first strip portions 41, respectively. The signal lines 2 each extend with while overlapping the second strip portions 42, respectively. In other words, the scanning lines 1 and the signal lines 2 are all formed in a meander shape.

First Embodiment

Figure 3:
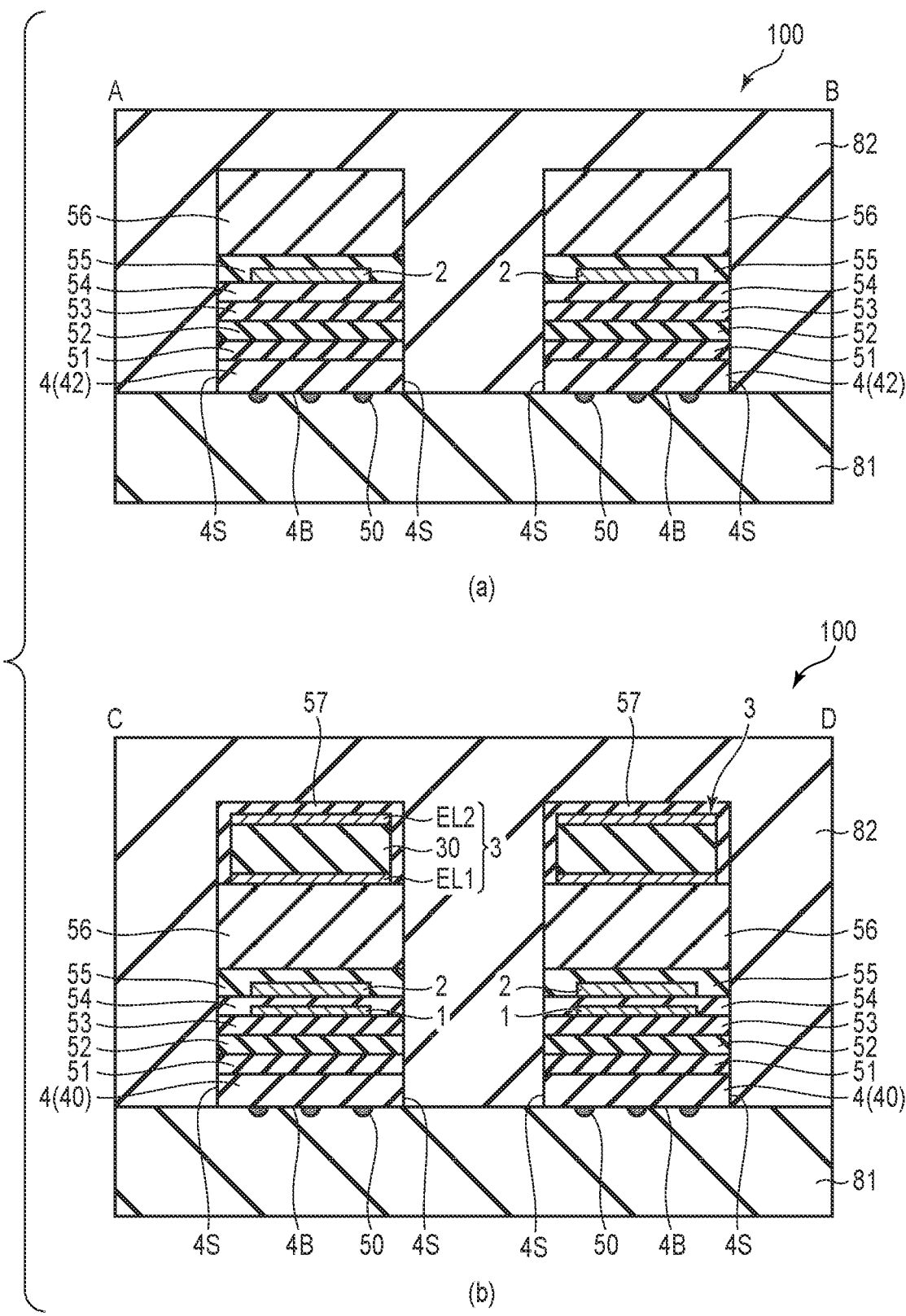
FIG. 3 is a cross-sectional view showing the flexible substrate shown in FIG. 2.

FIG. 3 is a cross-sectional view of the flexible substrate 100 shown in FIG. 2. FIG. 3, part (a) is a cross-sectional view of the flexible substrate 100 taken along line A-B shown in FIG. 2. FIG. 3, part (b) is a cross-sectional view of flexible substrate 100 taken along line C-D shown in FIG. 2.

As shown in FIG. 3, part (a) and part (b), the flexible substrate 100 further comprising insulating layers 51 to 56, an electrical element 3, a sealing layer 57 and an upper resin layer 82.

The insulating base 4 is located on the lower resin layer 81. The insulating layer 51 is located on the insulating base 4. The insulating layer 52 is located on the insulating layer 51. The insulating layer 53 is located on the insulating layer 52. As shown in FIG. 3, part (b), each scanning line 1 is located on the respective insulating layer 53. The scanning lines 1 can be formed of a metal material or a transparent conductive material, for example, and may be of a single-layer or a stacked-layer structure. The insulating layer 54 is located on the insulating layer 53 to cover the scanning line 1.

Each signal line 2 is located on the respective insulating layer 54. The signal lines 2 can be formed of a metal material or transparent conductive material, for example, and may be of a single-layer or stacked-layer structure. The insulating layer 55 is located on the insulating layer 54 to cover the signal line 2. The insulating layer 56 is located on the insulating layer 55.

All of the insulating layers 51 to 55 are inorganic insulating layers formed of inorganic insulating materials such as silicon oxide (SiO), silicon nitride (SiN) and silicon oxynitride (SiON). The insulating layer 56 is an organic insulating layer formed of an organic insulating material such as acrylic resin. The upper surface of the insulating layer 56 is substantially planarized.

As shown in FIG. 3, part (b), the electrical element 3 is located on the insulating layer 56. The electrical element 3 comprises a lower electrode EL1, a functional layer 30 and an upper electrode EL2.

The lower electrode EL1 is located on the insulating layer 56. The functional layer 30 is located on the lower electrode EL1. The upper electrode EL2 is located on the functional layer 30. That is, the functional layer 30 is located between the lower electrode EL1 and the upper electrode EL2. The lower electrode EL1 and the upper electrode EL2 are transparent electrodes formed of a transparent conductive material such as indium tin oxide (ITO) or indium zinc oxide (IZO). The upper electrode EL2 is connected to a feed line, not shown, to which a common potential, for example, is supplied.

The sealing layer 57 covers the electrical element 3. The sealing layer 57 inhibits moisture from entering the functional layer 30. The upper resin layer 82 covers the insulating base 4, the insulating layers 51 to 56, the electrical element 3, the sealing layer 57 and the like, and is in contact with the lower resin layer 81. Further, in the first embodiment, the upper resin layer 82 is in contact with a side surface 4S of the insulating base 4. The upper resin layer 82 is in contact with respective side surfaces of the insulating layers 51 to 56.

On a lower surface 4B of the insulating base 4, a release layer residue 50 is attached. The release layer residue 50 is a remainder of a release layer PL used in the manufacturing process to be described later. The release layer residue 50 is attached, for example, to lower surfaces of the first strip portions 41 and the second strip portions and lower surfaces of the island-shaped portion 40. The release layer PL, which will be described later, is formed, for example, of a silicon material, and therefore the release layer residue 50 is a silicon material.

Note that between each island-shaped portion 40 and the respective electrical element 3, a switching element is located, which is omitted from the illustration.

Next, with reference to FIGS. 4 to 10, a method of manufacturing the flexible substrate 100 according to the first embodiment will be described. FIGS. 4 to 10, in part (a) of each, show the manufacturing process in a cross-section of the flexible substrate 100 taken along line A-B shown in FIG. 2. On the other hand, FIGS. 4 to 10, in part (b) of each, show the manufacturing process in a cross-section of the flexible substrate 100 taken along line C-D shown in FIG. 2.

Figure 4:
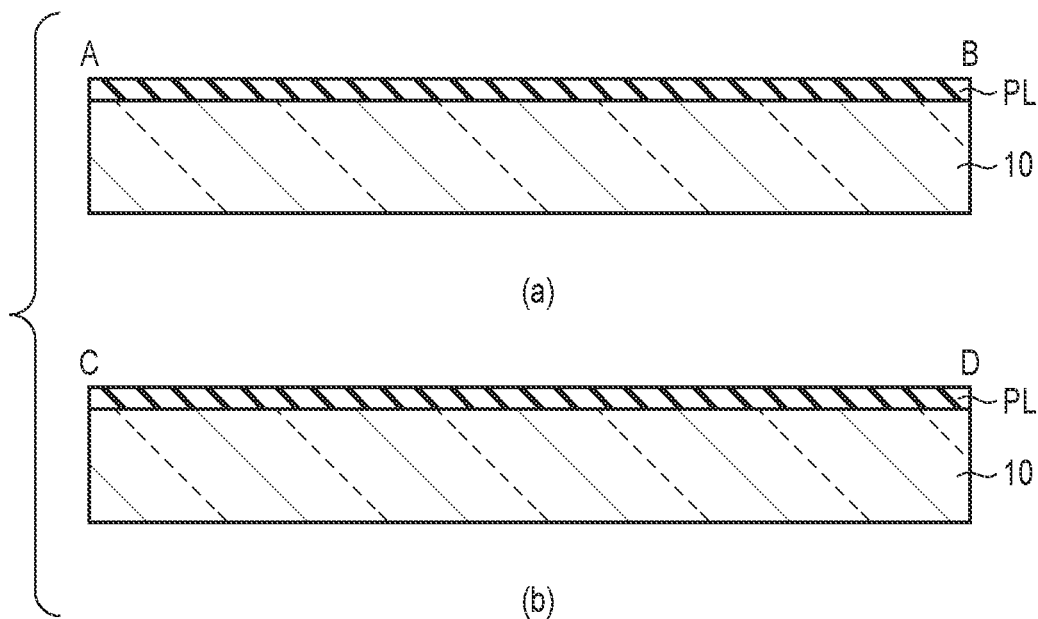
FIG. 4 is a diagram showing the first processing step of a method of manufacturing the flexible substrate according to the first embodiment.

FIG. 4 is a diagram illustrating the first step of the manufacturing method for the flexible substrate 100 according to the first embodiment.

As shown in FIG. 4, part (a) and part (b), a release layer PL is formed on substantially the entire surface of a glass substrate 10. The release layer PL is formed of, for example, a silicon material, as described above.

Figure 5:
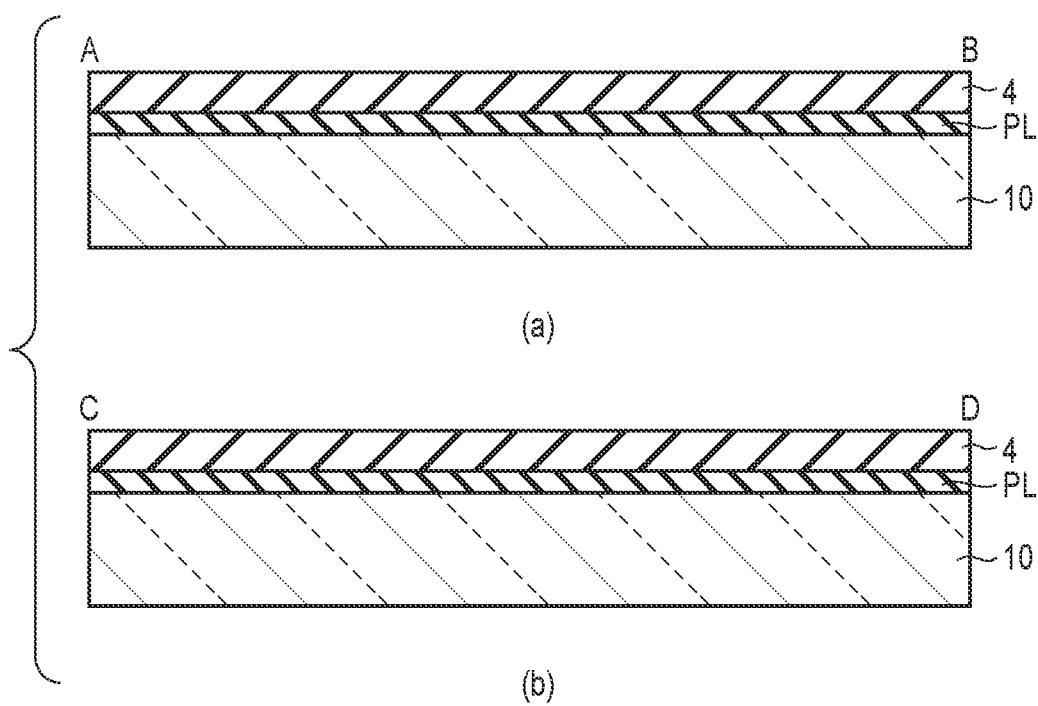
FIG. 5 is a diagram showing the second processing step of the method of manufacturing the flexible substrate according to the first embodiment.

FIG. 5 is a diagram illustrating the second step of the manufacturing method for the flexible substrate 100 according to the first embodiment.

As shown in FIG. 5, part (a) and part (b), the insulating base 4 is formed on substantially the entire upper surface of the release layer PL.

FIG. 6 is a diagram illustrating the third step of the manufacturing method for the flexible substrate 100 according to the first embodiment.

As shown in FIG. 6, part (a) and part (b), on the insulating base 4, a plurality of insulating layers 51 to 56, wiring lines such as scanning lines 1 and signal lines 2, electrical elements 3 and a sealing layer 57 are formed. The order of stacking of the layers of the components is similar to that shown in FIG. 3.

Figure 7:
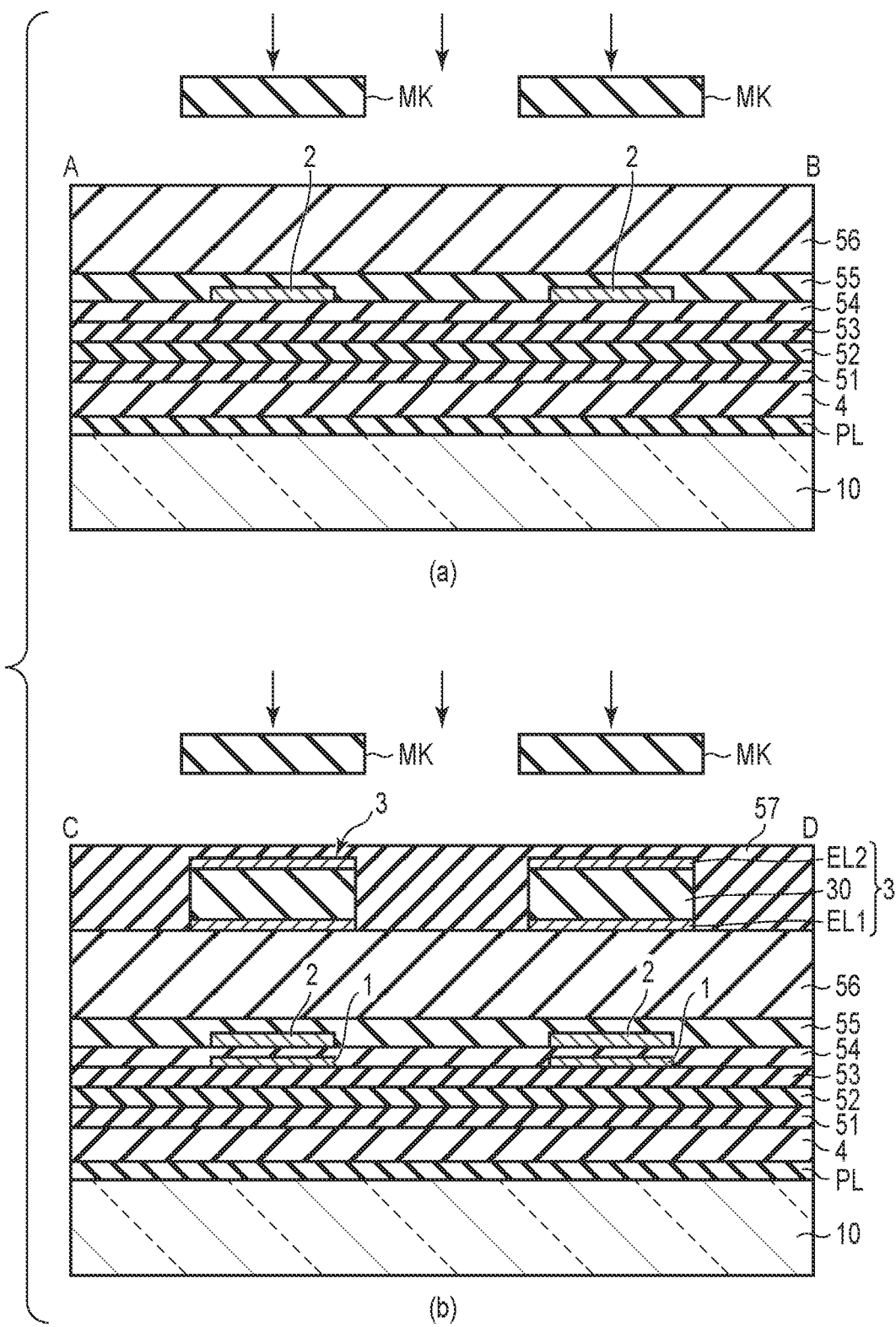
FIG. 7 is a diagram showing the fourth processing step of the method of manufacturing the flexible substrate according to the first embodiment.

FIG. 7 is a diagram illustrating the fourth step of the manufacturing method for the flexible substrate 100 according to the first embodiment.

As shown in FIG. 7, part (a) and part (b), the release layer PL, the insulating base 4, the multiple insulating layers 51 to 56 and the sealing layer 57 are collectively asked from above to the glass substrate 10 via a mask MK. That is, the mask MK is disposed above the flexible substrate 100. Further, the mask MK is placed in a position that overlaps the first strip portions 41, the second strip portions 42 and the island-shaped portions 40 shown in FIG. 2. In other words, by the fourth step, the patterns of the release layer PL, the insulating base 4, the insulating layers 51 to 56 and the sealing layer 57 are similar to the pattern of the insulating base 4 shown in FIG. 2.

Figure 8:
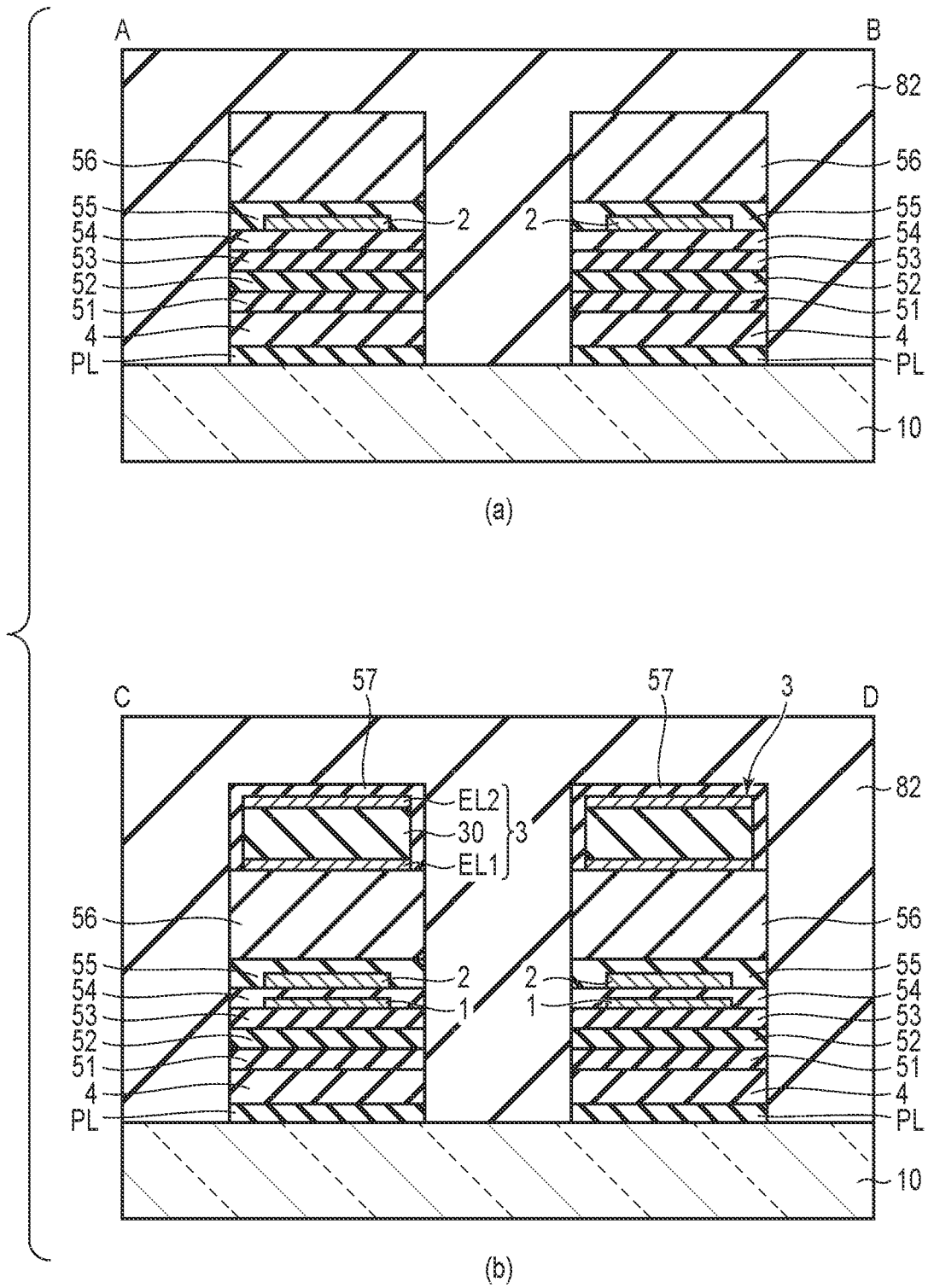
FIG. 8 is a diagram showing the fifth processing step of the method of manufacturing the flexible substrate according to the first embodiment.

FIG. 8 is a diagram illustrating the fifth step of the manufacturing method for the flexible substrate 100 according to the first embodiment.

As shown in FIG. 8, part (a) and part (b), an upper resin layer 82 is formed to cover the release layer PL, the insulating base 4, the multiple insulating layers 51 to 56, the electrical element 3, and the sealing layer 57. The upper resin layer 82 is, for example, a laminated stretchable resin film.

FIG. 9 is a diagram illustrating the sixth step of the manufacturing method for the flexible substrate 100 according to the first embodiment.

As shown in FIG. 9, part (a) and part (b), the interface between the release layer PL and the insulating base 4 is peeled off and thus the glass substrate 10 and the release layer PL are removed. After the glass substrate 10 and the release layer PL are removed, the release layer residue 50, which is a remainder of the release layer PL, is attached to the lower surface 4B of the insulating base 4.

Figure 10:
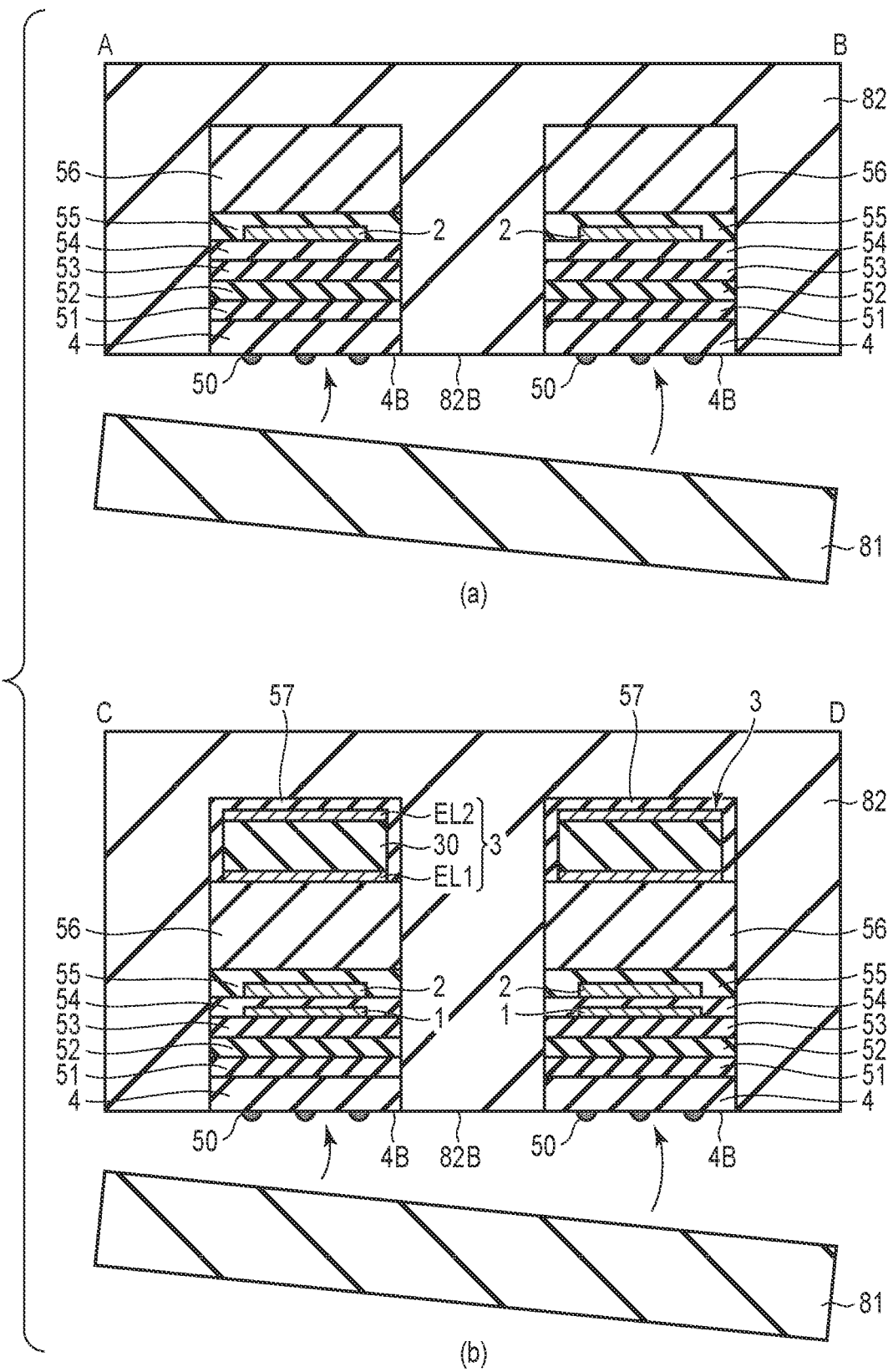
FIG. 10 is a diagram showing the seventh processing step of the method of manufacturing the flexible substrate according to the first embodiment.

FIG. 10 is a diagram illustrating the seventh step of the manufacturing method for the flexible substrate 100 according to the first embodiment.

As shown in FIG. 10, part (a) and part (b), a lower resin layer 81 is formed so as to be in contact with the lower surface 4B of the insulating base 4 and the lower surface 82B of the upper resin layer 82. The lower resin layer 81 is, for example, a laminated stretchable resin film.

As described above, by the processing steps shown in FIGS. 4 to 10, the flexible substrate 100 of the first embodiment is formed.

According to this embodiment, the release layer PL is formed between the glass substrate 10 and the insulating base 4. With this configuration, the load applied to the insulating base 4 when the glass substrate 10 is peeled off by a machine can be reduced. Therefore, damage to the insulation base 4 can be suppressed and the yield rate of peeling of the glass substrate can be improved.

Second Embodiment

Figure 11:
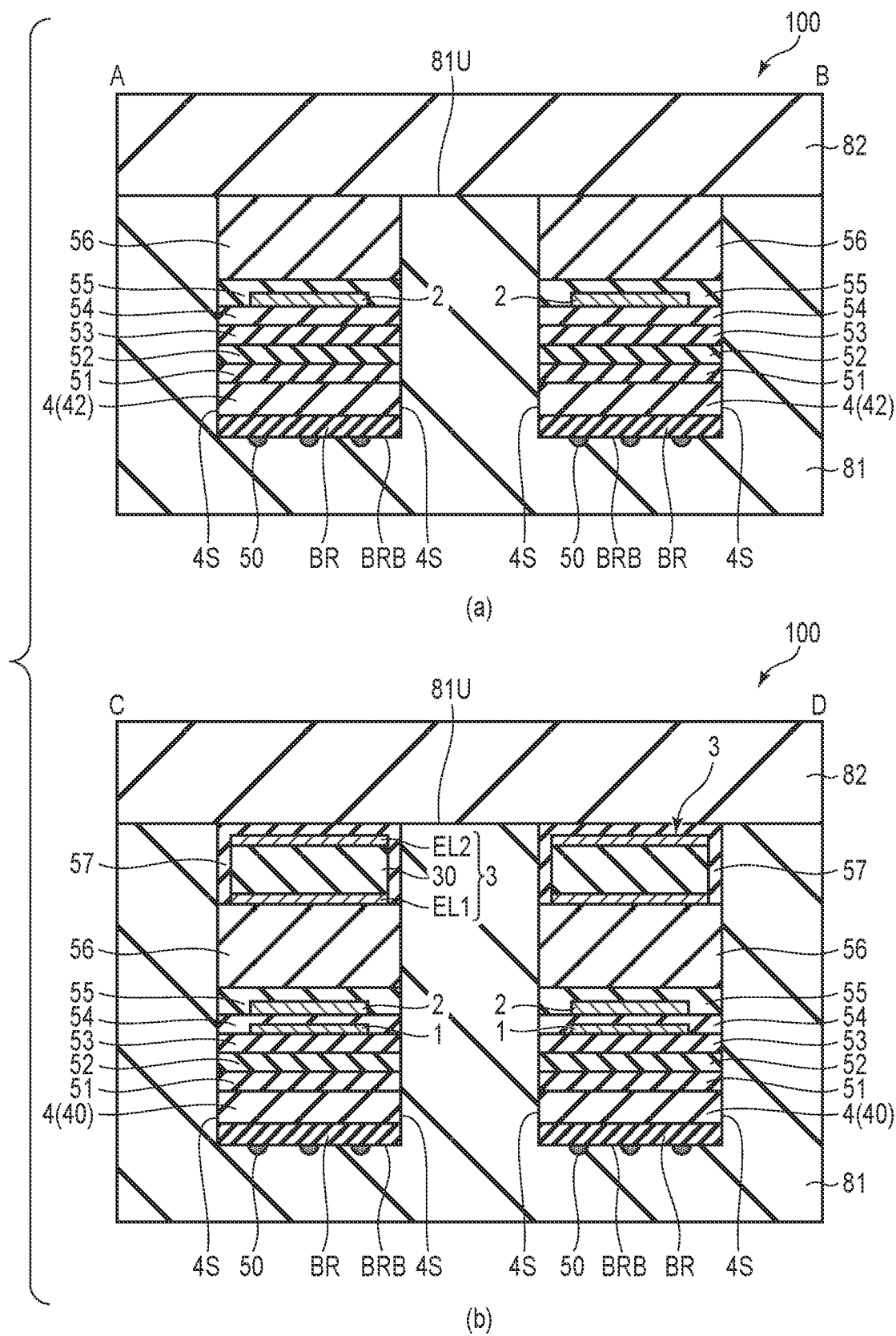
FIG. 11 is a cross-sectional view showing the flexible substrate shown in FIG. 2.

FIG. 11 is a cross-sectional view of the flexible substrate 100 shown in FIG. 2. FIG. 11, part (a), is a cross-sectional view of the flexible substrate 100 taken along line A-B shown in FIG. 2. FIG. 11, part (b), is a cross-sectional view of the flexible substrate 100 taken along line C-D shown in FIG. 2. The configuration shown in FIG. 11 is different from that of FIG. 3 mainly in that the flexible substrate 100 includes a barrier layer BR located under the insulating base 4.

The barrier layer BR is overlaid under the insulating base 4. The barrier layer BR is formed, for example, on both the lower surfaces of the first strip portions 41 and the second strip portions 42 and the lower surfaces of the island-shaped portions 40. The barrier layer BR is formed of one of inorganic, organic and metal materials.

The lower resin layer 81 covers the barrier layer BR, the insulating base 4, the insulating layers 51 to 56, the electrical element 3 and the sealing layer 57 from below, and is in contact with the upper resin layer 82. Further, in the second embodiment, the lower resin layer 81 is in contact with the side surface 4S of the insulating base 4. The lower resin layer 81 is in contact with the respective side surfaces of the insulating layers 51 to 56 as well. The upper resin layer 82 is in contact with an upper surface 81U of the lower resin layer 81. The upper surface 81U is located above the insulating layer 56 and the electrical element 3, for example.

To a lower surface BRB of the barrier layer BR, the release layer residue 50 is attached. The release layer residue 50 is a remainder of the release layer PL used in the manufacturing process described below. The release layer PL described below is formed of a silicon material, for example, and therefore the release layer residue 50 is a silicon material.

Next, with reference to FIGS. 12 to 19, a method of manufacturing the flexible substrate 100 according to the second embodiment will be described. FIGS. 12 to 19, in part (a) of each, show the manufacturing process in a cross-section of the flexible substrate 100 taken along line A-B shown in FIG. 2. FIGS. 12 to 19, in part (b) of each, show the manufacturing process in a cross-section of the flexible substrate 100 taken along line C-D shown in FIG. 2.

Figure 12:
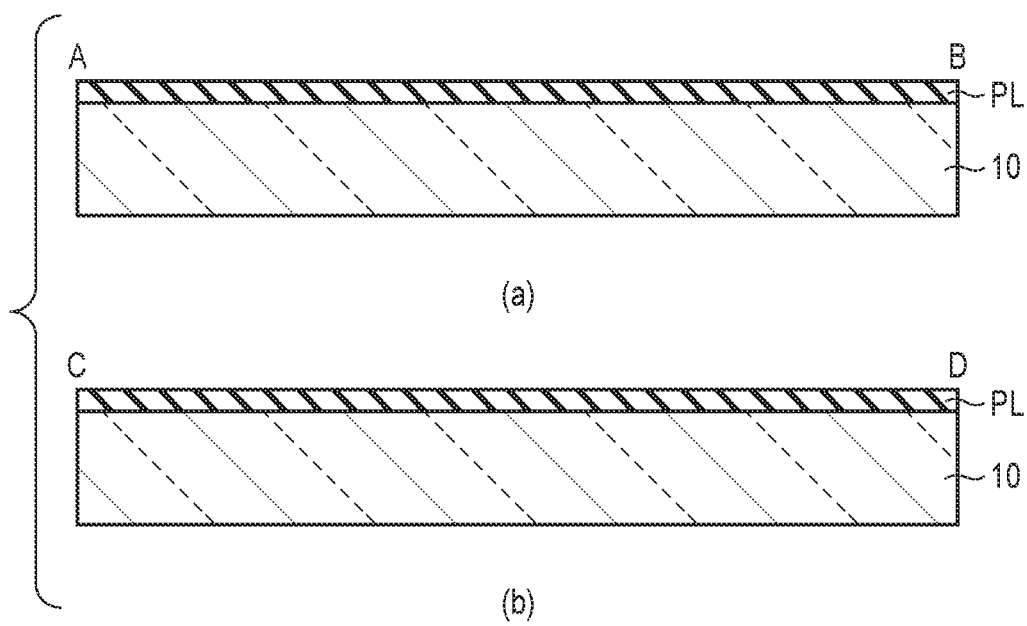
FIG. 12 is a diagram showing the first processing step of a method of manufacturing the flexible substrate according to the second embodiment.

FIG. 12 is a diagram illustrating the first step of the manufacturing method of the flexible substrate 100 according to the second embodiment.

As shown in FIG. 12, part (a) and part (b), a release layer PL is formed on substantially the entire surface of the glass substrate 10. The release layer PL is formed of, for example, a silicon material, as described above.

Figure 13:
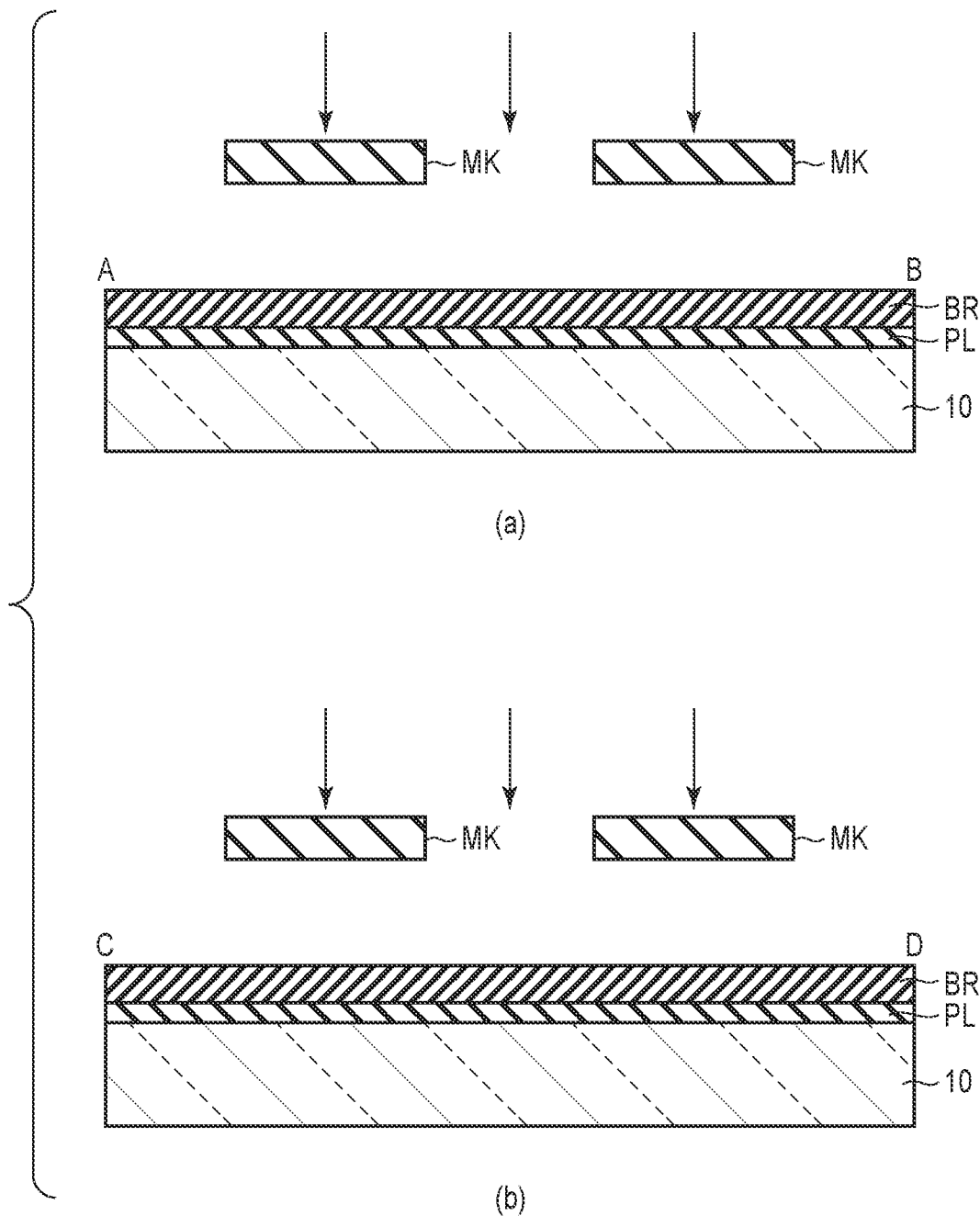
FIG. 13 is a diagram showing the second processing step of the method of manufacturing the flexible substrate according to the second embodiment.

FIG. 13 is a diagram illustrating the second step of the manufacturing method of the flexible substrate 100 according to the second embodiment.

As shown in FIG. 13, part (a) and part (b), a barrier layer BR is formed on substantially the entire surface on the release layer PL. Then, a mask MK is placed above the barrier layer BR, and the barrier layer BR is patterned. The barrier layer BR is patterned so that it remains in locations overlapping the first strip portions 41, the second strip portions 42 and the island-shaped portions 40 shown in FIG. 2.

Figure 14:
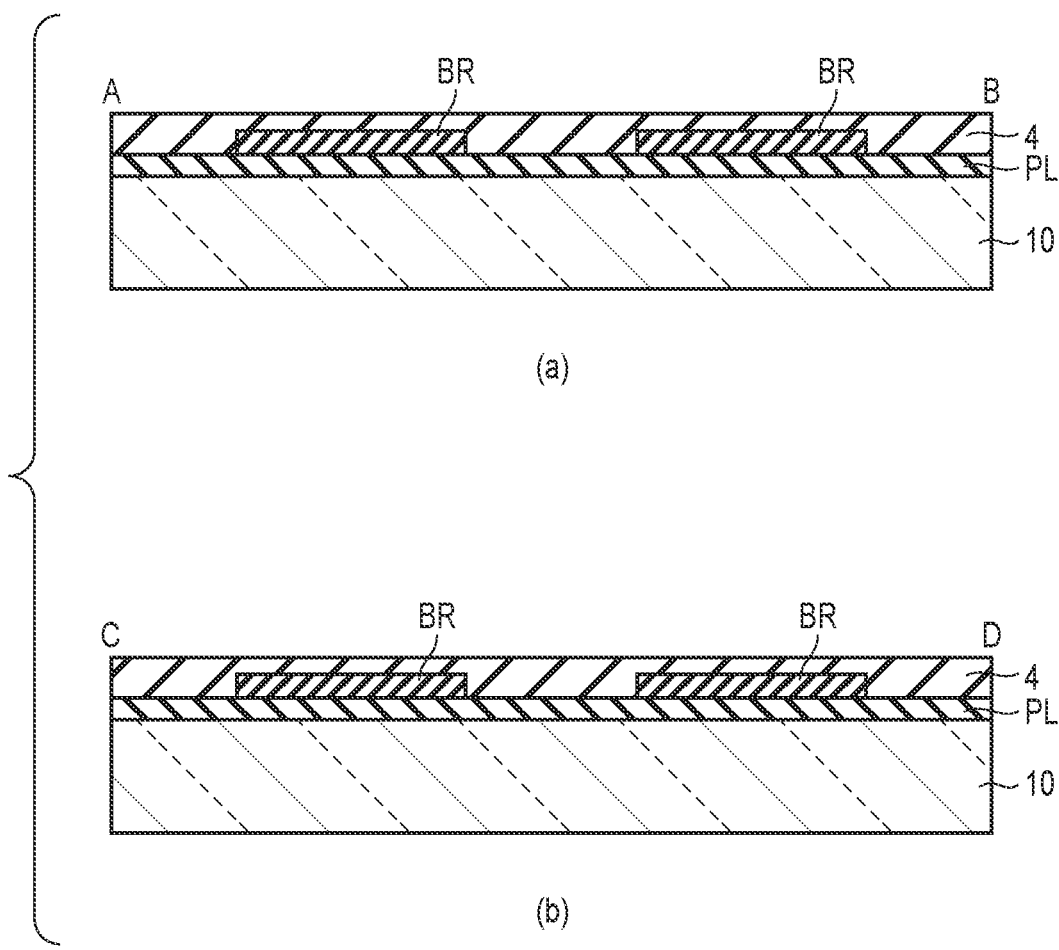
FIG. 14 is a diagram showing the third processing step of the method of manufacturing the flexible substrate according to the second embodiment.

FIG. 14 is a diagram illustrating the third step of the manufacturing method of the flexible substrate 100 according to the second embodiment.

As shown in FIG. 14, part (a) and part (b), the insulating base 4 is formed on substantially the entire surfaces of the barrier layer BR and the release layer PL.

Figure 15:
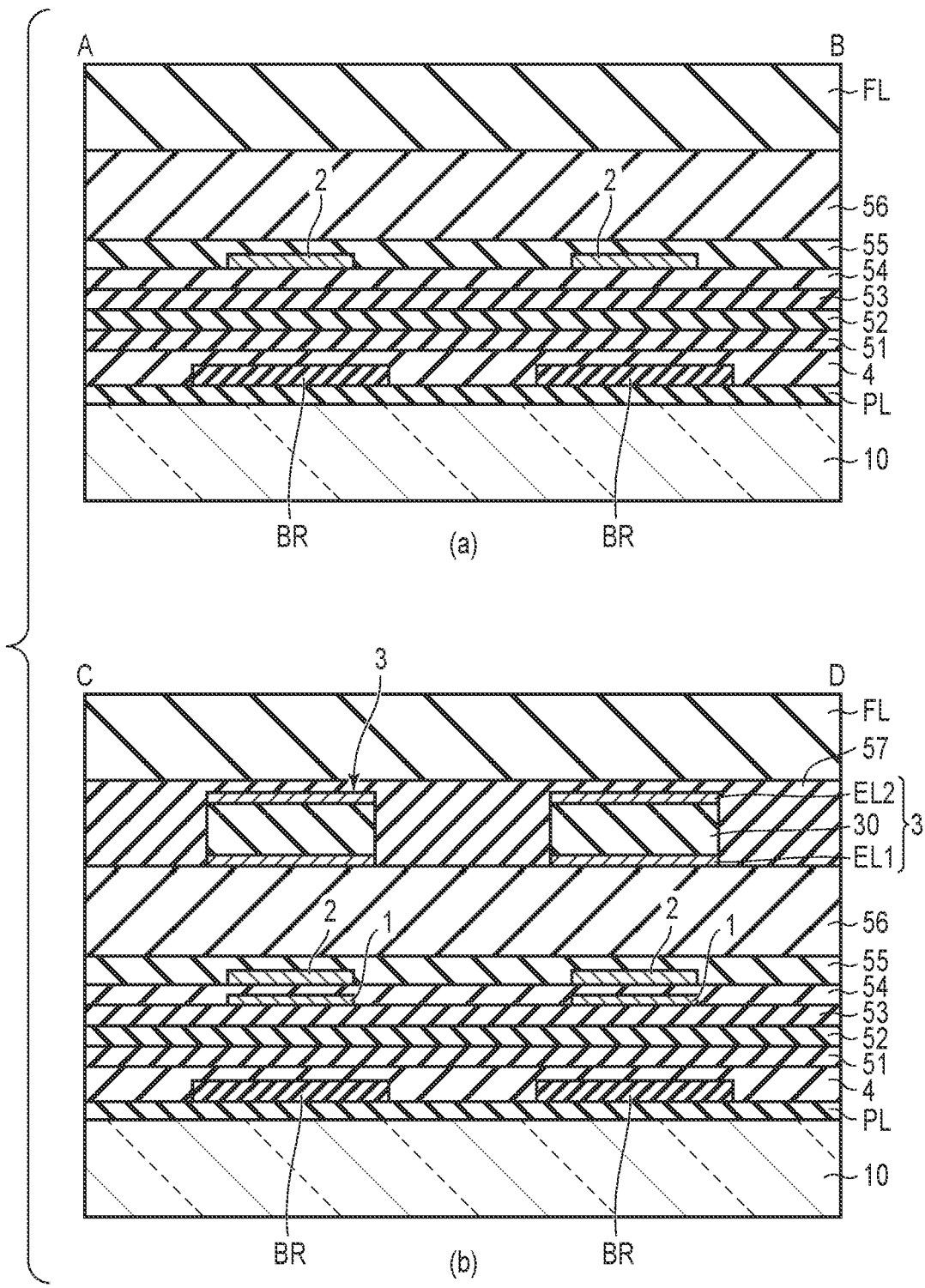
FIG. 15 is a diagram showing the fourth processing step of the method of manufacturing the flexible substrate according to the second embodiment.

FIG. 15 is a diagram illustrating the fourth step of the manufacturing method of the flexible substrate 100 according to the second embodiment.

As shown in FIG. 15, part (a) and part (b), the multiple insulating layers 51 to 56, wiring lines such as the scanning lines 1 and the signal lines 2, the electrical elements 3 and the sealing layer 57 are formed on the insulating base 4. The order of stacking of these components is similar to that shown in FIG. 11. Then, a temporary film FL is attached above the electrical elements 3. In the example illustrated in the drawing, the temporary film FL is in contact with the insulating layer 56 and the sealing layer 57.

Figure 16:
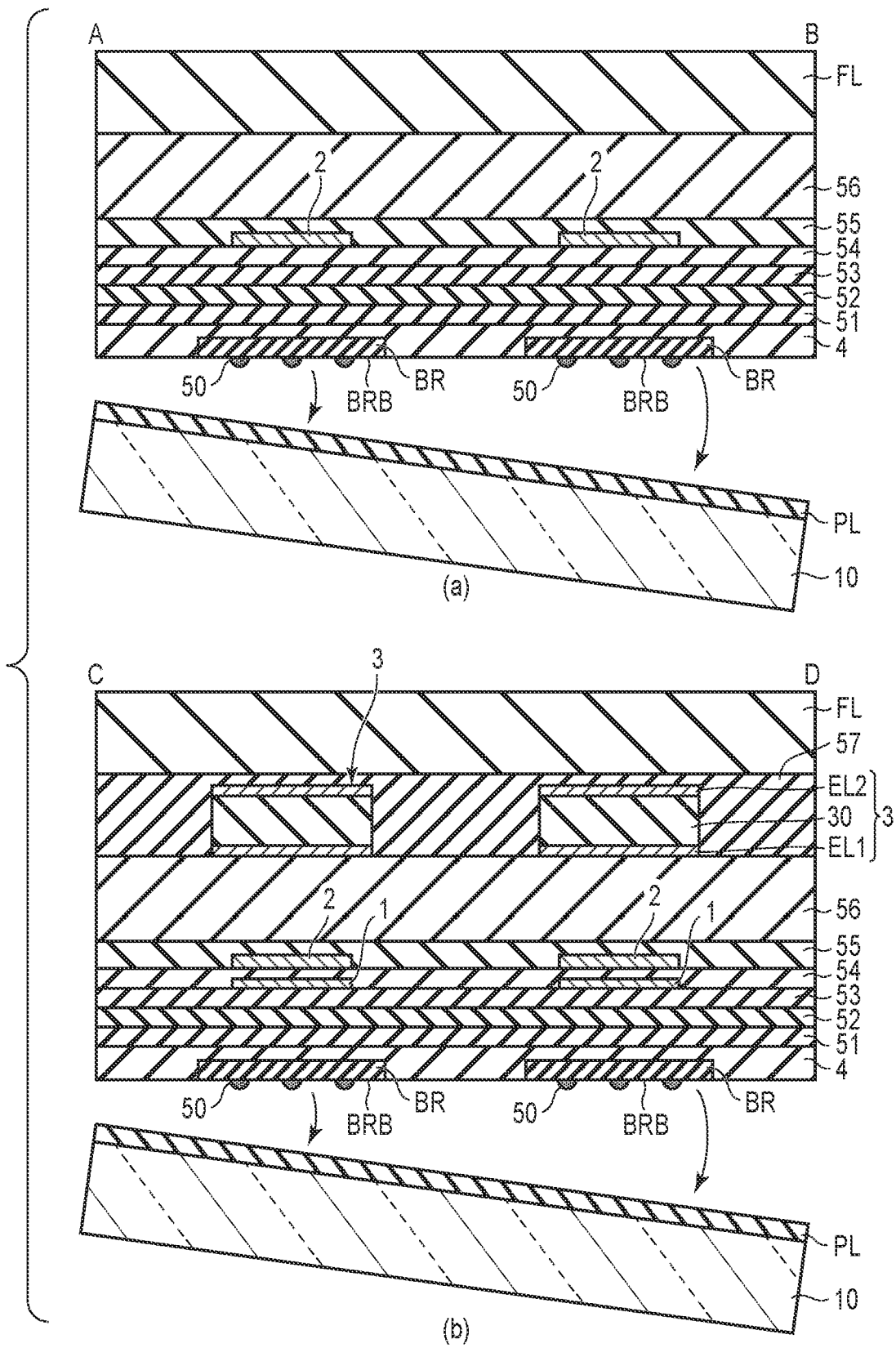
FIG. 16 is a diagram showing the fifth processing step of the method of manufacturing the flexible substrate according to the second embodiment.

FIG. 16 is a diagram illustrating the fifth step of the manufacturing method of the flexible substrate 100 according to the second embodiment.

As shown in FIG. 16, part (a) and part (b), the interface between the release layer PL and the barrier layer BR is peeled off, and thus the glass substrate 10 and the release layer PL are removed. At this time, the interface between the release layer PL and the insulating base 4 is peeled off as well. After the glass substrate 10 and the release layer PL are removed, the release layer residue 50 is attached, which is a remainder of the release layer PL attached on the lower surface BRB of the barrier layer BR.

Figure 17:
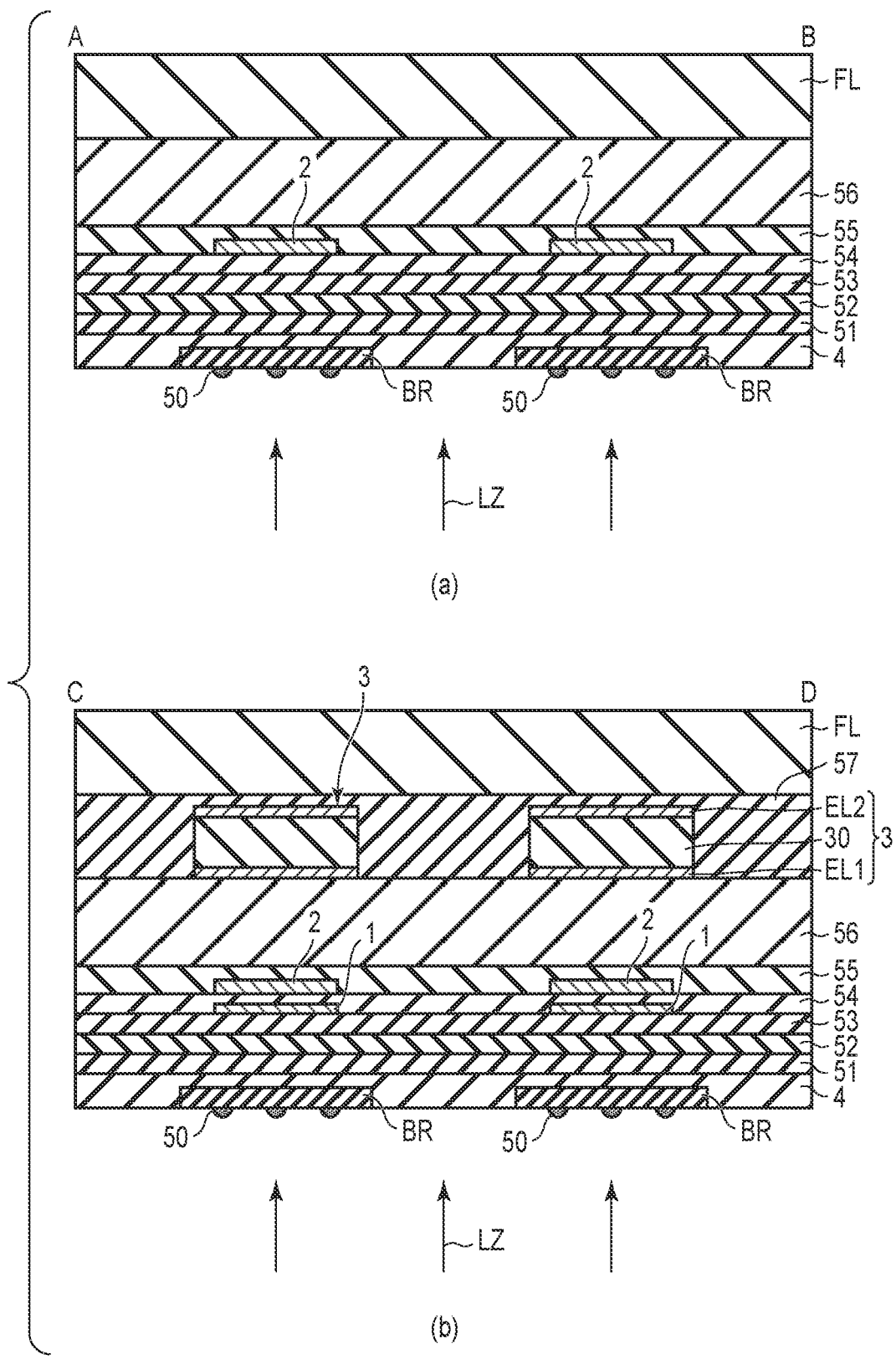
FIG. 17 is a diagram showing the sixth processing step of the method of manufacturing the flexible substrate according to the second embodiment.

FIG. 17 is a diagram illustrating the sixth step of the manufacturing method of the flexible substrate 100 according to the second embodiment.

As shown in FIG. 17, part (a) and part (b), the insulating base 4, the multiple insulating layers 51 to 56, and the sealing layer 57 are collectively etched to the temporary film FL by irradiating laser light LZ thereon from below using the barrier layer BR as a mask. The barrier layer BR is disposed at locations overlapping the first strip portions 41, the second strip portions 42 and the island-shaped portions 40 shown in FIG. 2. In other words, by the sixth step, the pattern of the insulating base 4, the insulating layers 51 to 56 and the sealing layer 57 becomes similar to that of the insulating base 4 shown in FIG. 2. The barrier layer BR absorbs less laser light LZ than the insulating base 4.

Therefore, the barrier layer BR protects those layers located from the insulating base 4 upwards against the laser light LZ.

For example, if the upper resin layer 82 is formed before the sixth step, the upper resin layer 82 may be damaged because it absorbs the laser light LZ. As a measure to this, in the sixth step, the temporary film FL is attached at the position where the upper resin layer 82 is formed in the subsequent processing step.

Figure 18:
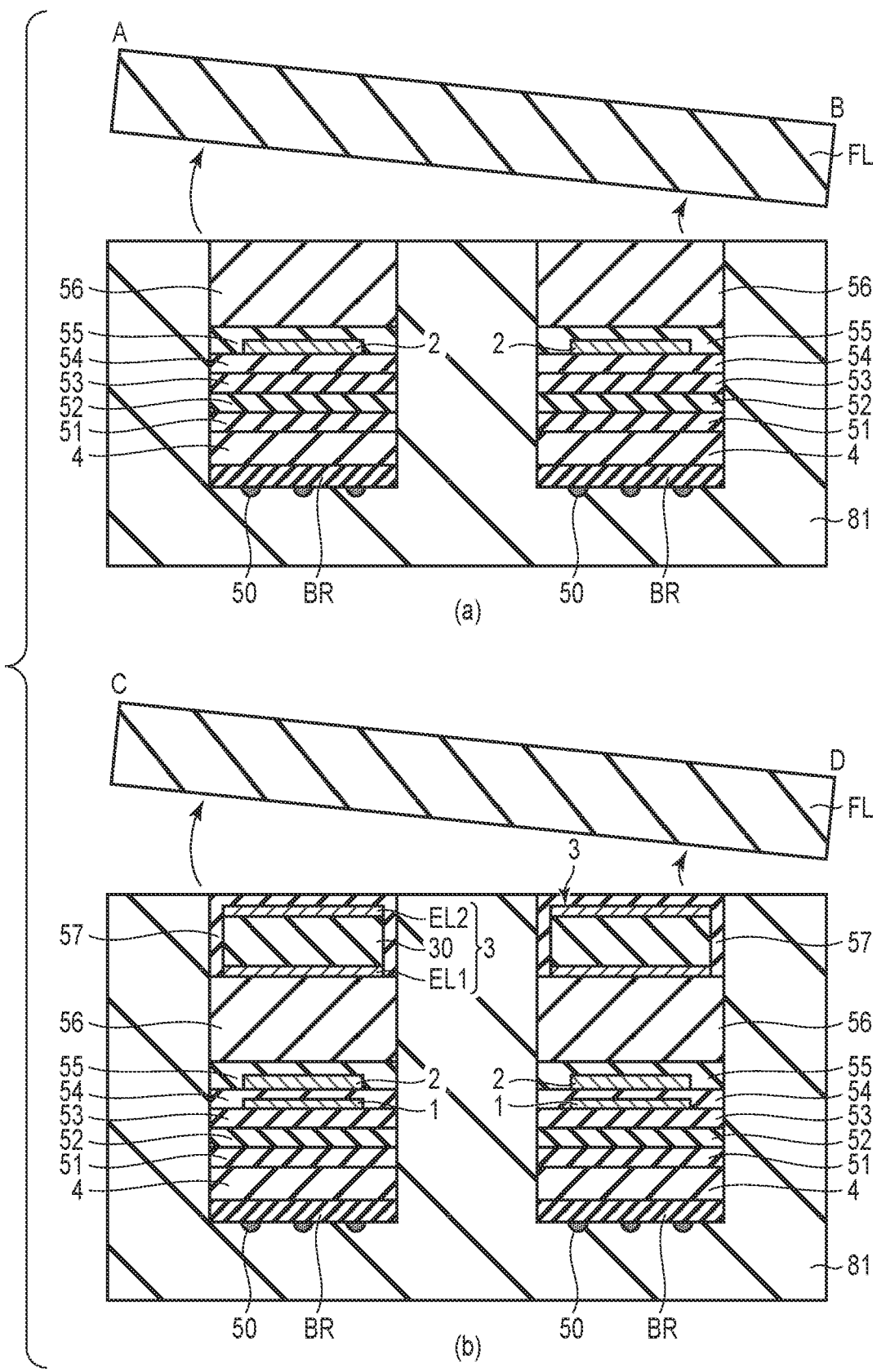
FIG. 18 is a diagram showing the seventh processing step of the method of manufacturing the flexible substrate according to the second embodiment.

FIG. 18 is a diagram illustrating the seventh step of the manufacturing method of the flexible substrate 100 according to the second embodiment.

As shown in FIG. 18, part (a) and part (b), a lower resin layer 81 is formed to cover the barrier layer BR, the insulating base 4, the multiple insulating layers 51 to 56, the electrical elements 3, and the sealing layer 57 from below. The lower resin layer 81 is, for example, a laminated stretchable resin film. After forming the lower resin layer 81, the temporary film FL is removed.

Figure 19:
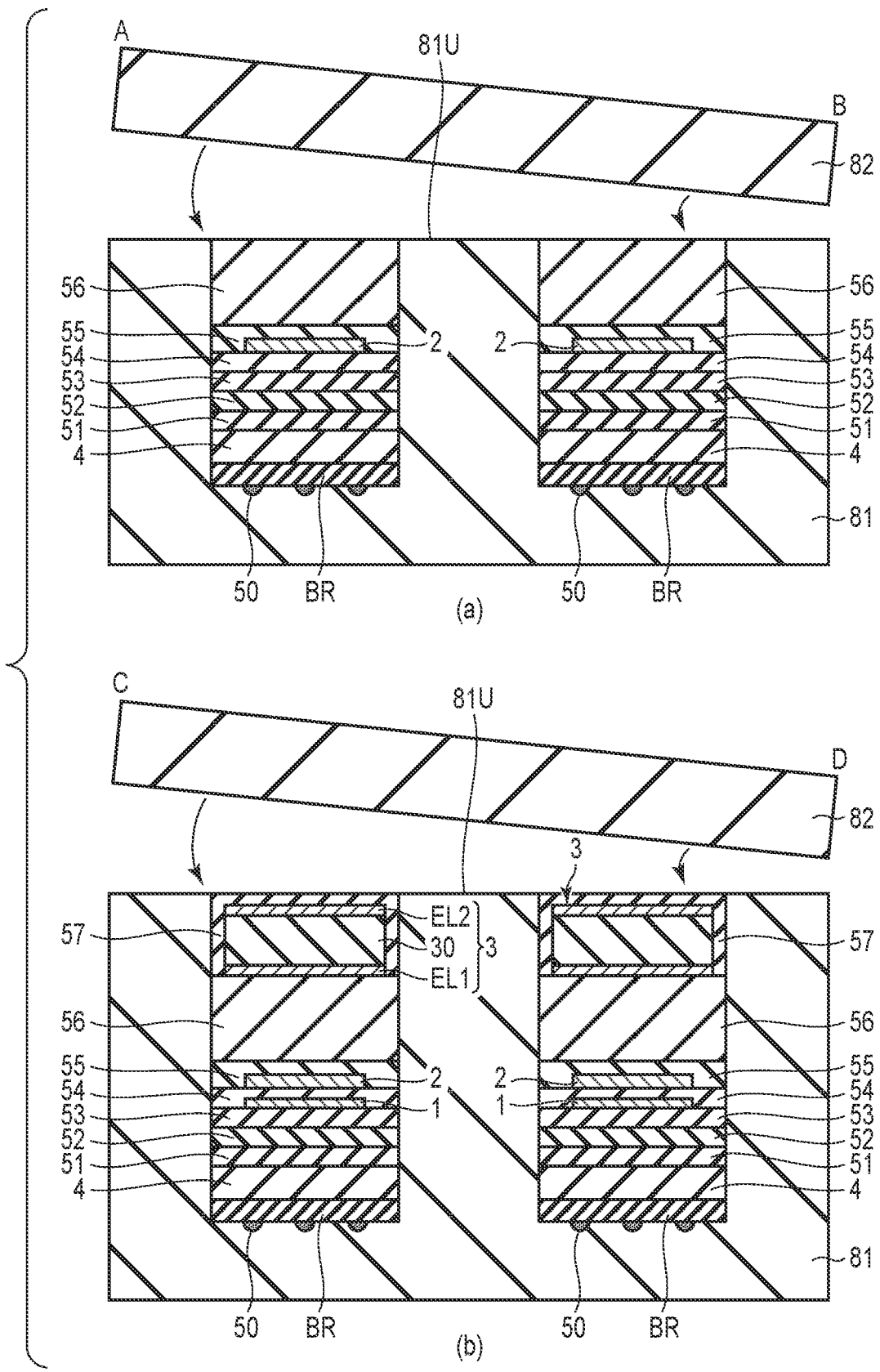
FIG. 19 is a diagram showing the eighth processing step of the method of manufacturing the flexible substrate according to the second embodiment.

FIG. 19 is a diagram illustrating the eighth step of the manufacturing method of the flexible substrate according to the second embodiment.

As shown in FIG. 19, part (a) and part (b), the upper resin layer 82 is formed to be in contact with an upper surface 81U of the lower resin layer 81. The upper resin layer 82 is, for example, a laminated stretchable resin film.

By the processing steps shown in FIGS. 12 to 19, the flexible substrate 100 of the second embodiment is formed.

According to the second embodiment, the barrier layer BR is formed below the insulating base 4. With this configuration, etching by laser light can be employed in the sixth step of the second embodiment, as compared to the use of ashing in the fourth step of the first embodiment. That is, by enabling processing by laser beam, there is no need to use ashing, which tends to create side edges. Therefore, the side surface configurations of the insulating base 4, the insulating layers 51 to 56 and the sealing layer 57 can be shaped closer to a continuous vertical plane. Thus, the quality of the flexible substrate 100 can be further improved.

As described above, according to the embodiments, it is possible to obtain a method for manufacturing a flexible substrate, which can improve the yield of peeling of a glass substrate and improve the quality of the flexible substrate, and to obtain such a flexible substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a flexible substrate, comprising:
   forming a release layer on a glass substrate;
   forming an insulating base on the release layer;
   forming a plurality of insulating layers, wiring lines and electrical elements on the insulating base;
   ashing the release layer, the insulating base and the plurality of insulating layers from above to the glass substrate via a mask;
   forming an upper resin layer which covers the release layer, the insulating base, and the plurality of insulating layers;
   removing the glass substrate and the release layer by peeling off at an interface between the release layer and the insulating base; and
   forming a lower resin layer so as to be in contact with a lower surface of the insulating base and a lower surface of the upper resin layer.

2. The method of claim 1, wherein
after removing the glass substrate and the release layer by peeling off at the interface between the release layer and the insulating base, residue of the release layer is maintained to be adhered to the lower surface of the insulating base.

3. The method of claim 1, wherein
the release layer is formed of a silicon material.

4. A method of manufacturing a flexible substrate, comprising:
   forming a release layer on a glass substrate;
   forming a barrier layer on the release layer;
   patterning the barrier layer;
   forming an insulating base on the barrier layer and the release layer;
   forming a plurality of insulating layers, wiring lines and electrical elements on the insulating base;
   attaching a temporary film above the electrical elements;
   removing the glass substrate and the release layer by peeling off at an interface between the release layer and the barrier layer;
   etching the insulating base and the plurality of insulating layers from below to the temporary film by laser irradiation using the barrier layer as a mask;
   forming a lower resin layer which covers the barrier layer, the insulating base and the plurality of insulating layers from below;
   removing the temporary film; and
   forming an upper resin layer so as to be in contact with an upper surface of the lower resin layer.

5. The method of claim 4, wherein
after removing the glass substrate and the release layer by peeling off at the interface between the release layer and the barrier layer, residue of the release layer is maintained to be adhered to a lower surface of the barrier layer.

6. The method of claim 4, wherein
the barrier layer is formed of any one of an inorganic material, an organic material and a metal material.

7. The method of claim 4, wherein
the barrier layer absorbs less laser light than the insulating base.

8. The method of claim 4, wherein
the release layer is formed of a silicon material.

* * * * *